(12) United States Patent
Harris et al.

(10) Patent No.: US 9,142,870 B2
(45) Date of Patent: Sep. 22, 2015

(54) VOLTAGE TUNING OF MICROWAVE MAGNETIC DEVICES USING MAGNETOELECTRIC TRANSDUCERS

(75) Inventors: Vincent Harris, Sharon, MA (US); Anton Geiler, Auburndale, MA (US); Carmine Vittoria, Charlestown, MA (US)

(73) Assignee: Northeastern University, Boston, MA (US)

( * ) Notice: Subject to any disclaimer, the term of this patent is extended or adjusted under 35 U.S.C. 154(b) by 294 days.

(21) Appl. No.: 13/574,780

(22) PCT Filed: Jan. 18, 2011

(86) PCT No.: PCT/US2011/021528
§ 371 (c)(1),
(2), (4) Date: Jul. 23, 2012

(87) PCT Pub. No.: WO2011/090933
PCT Pub. Date: Jul. 28, 2011

(65) Prior Publication Data
US 2012/0293023 A1    Nov. 22, 2012

Related U.S. Application Data

(60) Provisional application No. 61/296,997, filed on Jan. 21, 2010.

(51) Int. Cl.
*H01P 1/19*    (2006.01)
*H01L 41/12*   (2006.01)

(52) U.S. Cl.
CPC . *H01P 1/19* (2013.01); *H01L 41/12* (2013.01)

(58) Field of Classification Search
CPC .................................. H01L 41/12; H01P 1/19
USPC .................. 333/24.1, 158, 161, 204, 238, 205
See application file for complete search history.

(56) References Cited

U.S. PATENT DOCUMENTS

| | | | |
|---|---|---|---|
| 5,223,808 A * | 6/1993 | Lee et al. | 333/24.1 |
| 6,433,375 B1 | 8/2002 | Carlsson et al. | |
| 6,498,549 B1 * | 12/2002 | Jiang et al. | 333/202 |
| 6,531,936 B1 | 3/2003 | Chiu et al. | |
| 6,919,783 B2 * | 7/2005 | Dionne et al. | 333/205 |
| 6,984,902 B1 | 1/2006 | Huang et al. | |
| 7,528,688 B2 | 5/2009 | Srinivasan | |
| 2003/0197576 A1 | 10/2003 | Dionne et al. | |

(Continued)

OTHER PUBLICATIONS

Jungho Ryu, Carzao Vazquez, Kenji Uchino, and Hyoun-Ee Kim, "Magnetoelectric Properties in Piezoelectric and Magnetostrictive Laminate Composites" Aug. 2011, The Japan Socity of APplied Physics, vol. 40, pp. 4948-4951.*

(Continued)

*Primary Examiner* — Benny Lee
*Assistant Examiner* — Jorge Salazar, Jr.
(74) *Attorney, Agent, or Firm* — Wilmer Cutler Pickering Hale and Dorr LLP

(57) ABSTRACT

Tunable microwave magnetic devices that provide increased performance with reduced size, weight, and cost. The disclosed microwave magnetic devices are voltage-tunable devices that include ferrite substrates. To tune the devices, the magnetic permeability of the respective ferrite substrates is varied by external, voltage-tuned, magnetic fringe fields created by one or more magnetoelectric (ME) transducers.

20 Claims, 9 Drawing Sheets

(56) References Cited

U.S. PATENT DOCUMENTS

2005/0085051 A1 4/2005 Phillips et al.
2005/0206470 A1* 9/2005 Lin et al. .................. 333/24 R

OTHER PUBLICATIONS

International Search Report and Written Opinion issued by the U.S. Patent and Trademark Office for International Application No. PCT/US2011/021528 mailed Mar. 15, 2011 (8 pgs.).

Nan, et al., "Multiferroic Magnetoelectric Composites: Historical Perspective, Status, and Future Directions," J. Appl. Phys., vol. 103, 031101-1-031101-35 (2008).

Rodrigue, G.P., "A Generation of Microwave Ferrite Devices," Proc. IEEE, vol. 76, No. 2, pp. 121-137 (Feb. 1988).

Romanofsky, R.R., "Array Phase Shifters: Theory and Technology," NASA Report (2007) (Total 30 pgs.).

Roome, G.T. and Hair, H.A., "Thin Ferrite Devices for Microwave Integrated Circuits," IEEE Trans. Microwave Theory Tech., vol. 16, pp. 411-420 (Jul. 1968).

* cited by examiner

VOLTAGE TUNING OF MICROWAVE MAGNETIC DEVICES USING MAGNETOELECTRIC TRANSDUCERS

CROSS REFERENCE TO RELATED APPLICATIONS

This application claims benefit of the priority of International Application Number PCT/US 2011/021528, filed Jan. 18, 2011, which claims benefit of the priority of U.S. Provisional Patent Application No. 61/296,997 filed Jan. 21, 2010 entitled VOLTAGE TUNING OF MICROWAVE DEVICES USING MAGNETIC TRANSDUCERS.

STATEMENT REGARDING FEDERALLY SPONSORED RESEARCH OR DEVELOPMENT

This invention was made with support from the United States government under Grant No. 0925808 awarded by the National Science Foundation. The United States government has certain rights to this invention.

FIELD OF THE INVENTION

The present application relates generally to tunable microwave magnetic devices, and more specifically to voltage tuning of such microwave magnetic devices using magnetoelectric transducers.

BACKGROUND OF THE INVENTION

One type of microwave magnetic device that has long been recognized for its performance capabilities is the ferrite phase shifter. For example, ferrite phase shifters are known for their low insertion loss, microwave power-handling capabilities, high reliability, and high radiation tolerance. In conventional ferrite phase shifter devices, operation is typically based on electromagnetic wave propagation in low-loss magnetic materials, such as yttrium iron garnet (YIG) and spinel ferrites with cations of lithium, magnesium, nickel, and zinc. Further, such devices are typically biased using permanent magnets and/or current-driven coils.

However, conventional ferrite phase shifter devices have several drawbacks. For example, when such devices are biased using permanent magnets, the size, weight, and cost of the devices can increase, especially for ferrite phase shifters that are designed to operate at high frequencies (e.g., at or above X-band). Further, such devices biased using permanent magnets provide virtually no significant tunability of their operating frequencies. A degree of tunability can be achieved when the ferrite phase shifter devices are biased using current-driven coils. However, like the devices that are biased using permanent magnets, the devices biased using current-driven coils can also have increased size, weight, and cost. Further, such devices biased using current-driven coils generally exhibit increased DC power consumption, and long response times (e.g., on the order of milliseconds) due to the relatively large inductance of the coils. The use of such conventional ferrite phase shifter devices has therefore generally been limited to applications in which low insertion loss and high power handling capability prevail over essentially all other design considerations.

In order to reduce the DC power consumption and to improve the response times, some conventional ferrite phase shifter devices have incorporated latching-type ferrite phase shifters, which employ short current pulses to set the phase of the devices. For example, such latching-type ferrite phase shifters are typically designed using waveguide components and toroidal-shaped ferrite cores. Further, the toroidal shape of the ferrite cores provides a flux closure path, which can reduce the current drive requirements, and increase remnant magnetization within the ferrite cores. However, such devices that incorporate latching-type ferrite phase shifters can also have increased size and weight due to the relatively large waveguide components. The cost of fabricating such devices with waveguide components can also be high. Moreover, because the short current pulses used to set the phase of the devices typically provide discrete phase settings, such devices incorporating latching-type ferrite phase shifters have generally been incapable of providing the high level of accuracy required for critical applications, such as phased array radar systems.

In the conventional ferrite phase shifter devices described above, the operating frequencies have traditionally been tuned, when possible, using magnetic field tuning techniques, e.g., by changing the magnetic fields applied to the respective devices. However, such magnetic field tuning of ferrite phase shifter devices can be slow, and can require a considerable amount of power. To avoid the drawbacks of magnetic field tuning, electric field tuning techniques have been employed in some conventional ferrite phase shifter devices. In such devices, a ferrite layer is typically bonded to a piezoelectric layer to form a ferrite/piezoelectric composite element. Further, to tune the operating frequencies of such devices, an electric field is created in the composite element to produce, via the magnetoelectric (ME) effect, a mechanical strain in the piezoelectric layer that transmits a force to the ferrite layer. The force transmitted to the ferrite layer of the composite element manifests itself as an internal magnetic field that can change the phase shift of the electromagnetic waves propagating through the ferrite layer.

However, electric field tuning of conventional ferrite phase shifter devices also has several drawbacks. For example, for optimum results, the ferrite layer of the ferrite/piezoelectric composite element included in such devices should have a large magnetostriction constant. However, ferrite materials that have low insertion loss generally exhibit low magnetostriction. For this reason, such devices have typically been designed to operate near the ferromagnetic resonance (FMR) frequency, where small internal magnetic fields generated via the ME effect in the ferrite layer can cause large variations in the magnetic permeability of the ferrite layer, thereby facilitating tuning of the devices. However, operating such conventional ferrite phase shifter devices near FMR can limit the bandwidth of the devices, and cause increased electromagnetic wave propagation losses.

It would therefore be desirable to have tunable microwave magnetic devices, and methods of tuning such microwave magnetic devices, that avoid at least some of the drawbacks associated with the conventional microwave magnetic devices described above.

BRIEF SUMMARY OF THE INVENTION

In accordance with the present application, tunable microwave magnetic devices are disclosed that provide increased performance with reduced size, weight, and cost. The presently disclosed microwave magnetic devices are voltage-tunable devices that include ferrite substrates. To tune the devices, the magnetic permeability of the respective ferrite substrates is varied by external, voltage-tuned, magnetic fringe fields created by one or more magnetoelectric (ME) transducers.

In accordance with one aspect, a voltage-tunable microwave magnetic device includes a ferrite substrate, such as a polycrystalline yttrium iron garnet (YIG) substrate, or any other suitable ferrite substrate. For example, the microwave magnetic device can be a ferrite phase shifter, a resonator, a delay line, a filter such as a band-pass or band-stop filter, a circulator, a limiter, an isolator, an antenna, or any other suitable microwave magnetic device. Moreover, an ME transducer for use in tuning the microwave magnetic device includes one or more piezoelectric layers, and one or more magnetostrictive layers. Each of the one or more magnetostrictive layers is bonded to at least one of the one or more piezoelectric layers. In accordance with an exemplary aspect, the microwave magnetic device and at least one such ME transducer can be implemented in the same device, or in separate devices. For example, the piezoelectric layer included in the ME transducer can be implemented using a lead magnesium niobate-lead titanate (PMN-PT) single crystal, or any other suitable piezoelectric material. Further, the magnetostrictive layer included in the ME transducer can be implemented using Terfenol-D, or any other suitable magnetostrictive material.

In accordance with an exemplary mode of operation, a voltage is applied across at least one piezoelectric layer of an ME transducer to create an electric field that produces, via the ME effect, a mechanical strain in the piezoelectric layer. The mechanical strain in the piezoelectric layer transmits a force in at least one magnetostrictive layer of the ME transducer, inducing an effective internal magnetic field within the magnetostrictive layer that varies the magnetization state of that layer. Such variation of the magnetization state of the magnetostrictive layer creates an external, voltage-tuned, magnetic fringe field emanating from the edges of the magnetostrictive layer. In accordance with an exemplary aspect, the magnetostrictive layer of the ME transducer is disposed in the plane of, and in contact with, the ferrite substrate of the microwave magnetic device. As a result, the magnetic fringe field emanating from the edges of the magnetostrictive layer can effectively penetrate the ferrite substrate, thereby varying the magnetic permeability of the ferrite substrate for tuning the microwave magnetic device.

By applying a voltage across at least one ME transducer to create at least one voltage-tuned magnetic fringe field emanating from the edges of the ME transducer, and using the magnetic fringe field to tune a microwave magnetic device, voltage tuning of such devices can be achieved with reduced DC power consumption and improved response time. Further, because the magnetic fringe field is created external to a ferrite substrate typically included in the microwave magnetic device, the ferrite substrate can have low insertion loss and low magnetostriction. The microwave magnetic device can therefore be designed to operate away from the ferromagnetic resonance (FMR) frequency, thereby improving the device bandwidth and decreasing electromagnetic wave propagation losses. Moreover, because fabrication processes can be employed to produce such microwave magnetic devices in miniaturized, planar form, the size, weight, and cost of such devices can be reduced.

Other features, functions, and aspects of the invention will be evident from the Drawings and/or the Detailed Description of the Invention that follow.

BRIEF DESCRIPTION OF THE SEVERAL VIEWS OF THE DRAWINGS

The invention will be more fully understood with reference to the following Detailed Description of the Invention in conjunction with the drawings of which:

FIG. 3b is a graphical illustration of magnetostriction constant and magnetization for a magnetostrictive layer included in the ME transducer of FIG. 3a;

FIG. 3c is a graphical illustration of magnetic fringe field as a function of applied voltage for the ME transducer of FIG. 3a;

FIG. 4b is a graphical illustration of simulated and measured insertion loss, and simulated and measured return loss, for the meander line micro-strip ferrite phase shifter of FIG. 4a;

FIG. 4c is a graphical illustration of differential phase shift for the meander line micro-strip ferrite phase shifter of FIG. 4a;

DETAILED DESCRIPTION OF THE INVENTION

The disclosure of U.S. Provisional Patent Application No. 61/296,997 filed Jan. 21, 2010 entitled VOLTAGE TUNING OF MICROWAVE MAGNETIC DEVICES USING MAGNETOELECTRIC TRANSDUCERS is incorporated herein by reference in its entirety.

Tunable microwave magnetic devices are disclosed that provide increased performance with reduced size, weight, and cost. The presently disclosed microwave magnetic devices are voltage-tunable devices that include ferrite substrates. To tune the devices, the magnetic permeability of the respective ferrite substrates is varied by external, voltage-tuned, magnetic fringe fields created by one or more magnetoelectric (ME) transducers.

Figure 1:
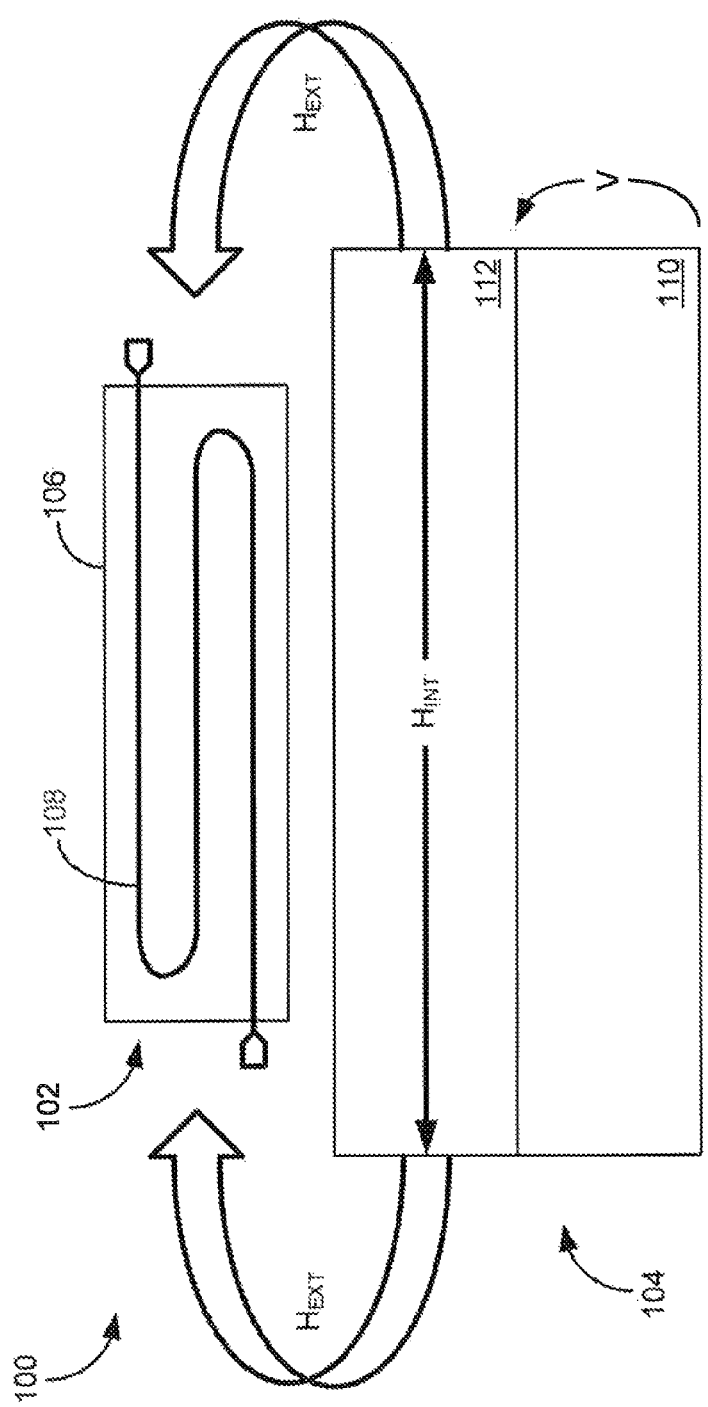
FIG. 1 is a conceptual view of an exemplary voltage-tunable microwave magnetic device, according to the present application.

FIG. 1 depicts a conceptual view of an illustrative embodiment of an exemplary voltage-tunable microwave magnetic device 100, in accordance with the present application. As shown in FIG. 1, the microwave magnetic device 100 includes a meander line micro-strip circuit 102, and an ME transducer 104. For example, the meander line micro-strip circuit 102 can be implemented as a meander line micro-strip ferrite phase shifter, or any other suitable type of meander line micro-strip circuit. Further, in one or more alternative embodiments, the circuit 102 can be implemented as a resonator, a delay line, a filter such as a band-pass or band-stop filter, a circulator, a limiter, an isolator, an antenna, or any other circuit suitable to be incorporated into such a microwave magnetic device.

As further shown in FIG. 1, the meander line micro-strip circuit 102 includes a ferrite substrate 106, and a micro-strip line 108 formed on the ferrite substrate 106. For example, the ferrite substrate 106 can be implemented as a polycrystalline yttrium iron garnet (YIG) substrate, or any other suitable type of substrate. Moreover, the ME transducer 104 includes a piezoelectric layer 110, and a magnetostrictive layer 112 mechanically coupled to the piezoelectric layer 110, thereby forming a magnetostrictive/piezoelectric composite element. For example, the magnetostrictive layer 112 can be implemented as a ferrite layer, or any other suitable type of magnetostrictive layer.

To tune the meander line micro-strip circuit 102 of FIG. 1, a voltage, V, is applied across the piezoelectric layer 110 of the ME transducer 104 to create an electric field that produces, via the ME effect, a mechanical strain in the piezoelectric layer 110. The mechanical strain in the piezoelectric layer 110 transmits, in turn, a force to the magnetostrictive layer 112 of the ME transducer 104, thereby inducing an effective internal magnetic field, $H_{INT}$, within the magnetostrictive layer 112 that varies the magnetization state of the magnetostrictive layer 112. Such variation of the magnetization state of the magnetostrictive layer 112 creates an external, voltage-tuned, magnetic fringe field, $H_{EXT}$, that emanates from the edges of the magnetostrictive layer 112. The magnetic fringe field, $H_{EXT}$, emanating from the edges of the magnetostrictive layer 112 effectively penetrates the ferrite substrate 106 of the meander line micro-strip circuit 102, varying the magnetic permeability of the ferrite substrate 106. In this way, the meander line micro-strip circuit 102 can be tuned using the external magnetic fringe field, $H_{EXT}$, created by the ME transducer 104.

Figure 2:
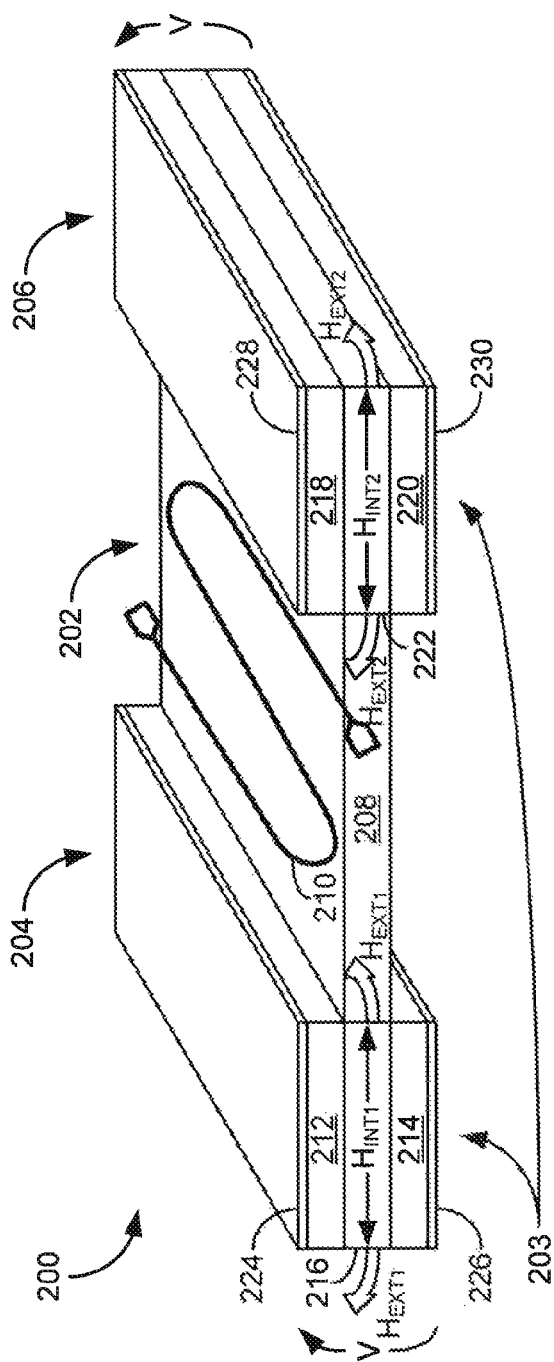
FIG. 2 is a perspective view of another exemplary voltage-tunable microwave magnetic device, according to the present application.

FIG. 2 depicts a perspective view of an illustrative embodiment of another exemplary voltage-tunable microwave magnetic device 200, according to the present application. As shown in FIG. 2, the microwave magnetic device 200 includes a meander line micro-strip circuit 202, such as a meander line micro-strip ferrite phase shifter or any other suitable meander line micro-strip circuit, and an ME transducer 203. The meander line micro-strip circuit 202 includes a ferrite substrate 208, and a micro-strip line 210 formed on the ferrite substrate 208. For example, the ferrite substrate 208 can be implemented as a YIG substrate, or any other suitable type of substrate. The ME transducer 203 includes a first ME transducer 204, and a second ME transducer 206. In accordance with the illustrative embodiment of FIG. 2, the ME transducers 204, 206 can be identical to one another.

As further shown in FIG. 2, the ME transducer 204 includes two piezoelectric layers 212, 214, and a magnetostrictive layer 216 sandwiched between, and mechanically coupled to, the piezoelectric layers 212, 214, thereby forming a first magnetostrictive/piezoelectric composite element. The ME transducer 204 further includes an electrode 224 deposited on the exposed upper surface of the piezoelectric layer 212, and an electrode 226 deposited on the exposed lower surface of the piezoelectric layer 214. Similarly, the ME transducer 206 includes two piezoelectric layers 218, 220, and a magnetostrictive layer 222 sandwiched between, and mechanically coupled to, the piezoelectric layers 218, 220, thereby forming a second magnetostrictive/piezoelectric composite element. The ME transducer 206 further includes an electrode 228 deposited on the exposed upper surface of the piezoelectric layer 218, and an electrode 230 deposited on the exposed lower surface of the piezoelectric layer 220. Each of the magnetostrictive layers 216, 222 is disposed proximate to the ferrite substrate 208 of the meander line micro-strip circuit 202. In accordance with the illustrative embodiment of FIG. 2, each of the magnetostrictive layers 216, 222 is disposed in the plane of, and in contact with, the ferrite substrate 208. For example, each of the magnetostrictive layers 216, 222 can be implemented using Terfenol-D, or any other suitable type of magnetostrictive material. Moreover, each of the piezoelectric layers 212, 214, 218, 220 can be implemented using lead magnesium niobate-lead titanate (PMN-PT) single crystals, or any other suitable type of piezoelectric material.

In accordance with an exemplary mode of operation, a voltage, V, is applied across the electrodes 224, 226 of the ME transducer 204, and across the electrodes 228, 230 of the ME transducer 206. The applied voltage, V, creates an electric field in each of the ME transducers 204, 206 that produces, via the ME effect, a mechanical strain in the piezoelectric layers 212, 214, and a mechanical strain in the piezoelectric layers 218, 220. The mechanical strain in the piezoelectric layers 212, 214 transmits a force in the magnetostrictive layer 216 of the ME transducer 204, inducing an effective internal magnetic field, $H_{INT1}$, within the magnetostrictive layer 216 that varies the magnetization state of that layer 216. Similarly, the mechanical strain in the piezoelectric layers 218, 220 transmits a force in the magnetostrictive layer 222 of the ME transducer 206, inducing an effective internal magnetic field, $H_{INT2}$, within the magnetostrictive layer 222 that varies the magnetization state of that layer 222. Such variation of the magnetization states of the magnetostrictive layers 216, 222 creates external, voltage-tuned, magnetic fringe fields $H_{EXT1}$, $H_{EXT2}$, emanating from the edges of the magnetostrictive layers 216, 222, respectively. Because each of the magnetostrictive layers 216, 222 is disposed in the plane of, and in contact with, the ferrite substrate 208 of the meander line micro-strip circuit 202, the magnetic fringe fields $H_{EXT1}$, $H_{EXT2}$, emanating from the edges of the magnetostrictive layers 216, 222, respectively, effectively penetrate the ferrite substrate 208, thereby varying the magnetic permeability of the ferrite substrate 208 for tuning the microwave magnetic device 200.

Figure 3A:
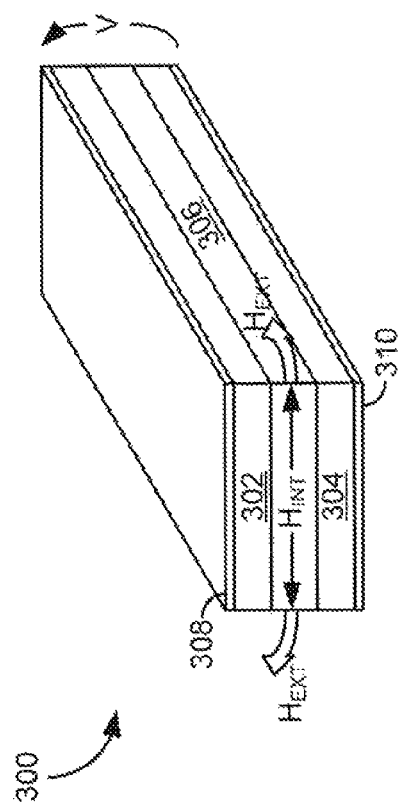
FIG. 3a is a perspective view of an exemplary magneto-electric (ME) transducer that can be employed in conjunction with the voltage-tunable microwave magnetic device of FIG. 2.
Figure 3B:
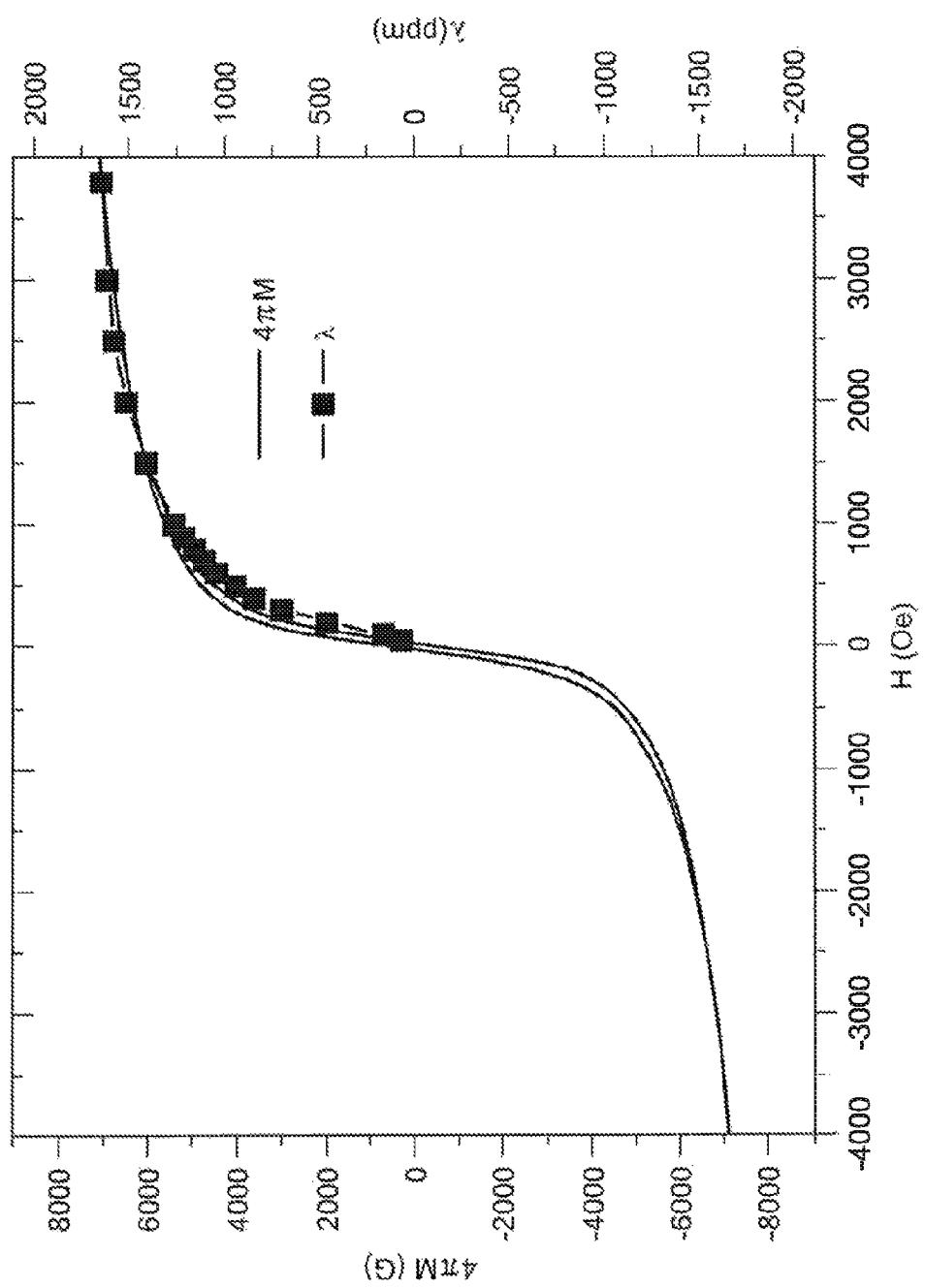

The disclosed tunable microwave magnetic devices of the present application will be further understood with reference to the following illustrative, non-limiting examples, and FIGS. 3a to 5. In a first illustrative example, an exemplary ME transducer 300 is provided, as depicted in FIG. 3a. For example, each of the ME transducers 204, 206 included in the microwave magnetic device 200 of FIG. 2 can be like the ME transducer 300 of FIG. 3a. As shown in FIG. 3a, the ME transducer 300 includes two piezoelectric layers 302, 304, and a magnetostrictive layer 306 sandwiched between, and mechanically coupled to, the piezoelectric layers 302, 304, thereby forming a magnetostrictive/piezoelectric composite element. The ME transducer 300 further includes an electrode 308 deposited on the exposed upper surface of the piezoelectric layer 302, and an electrode 310 deposited on the exposed lower surface of the piezoelectric layer 304.

In this first illustrative example, the magnetostrictive layer 306 is implemented as a slab of Terfenol-D having a length of about 15 mm, a width of about 10 mm, and a thickness of about 1 mm. Further, each of the piezoelectric layers 302, 304 is implemented as a lead magnesium niobate-lead titanate (PMN-PT) single crystal having substantially the same dimensions as the magnetostrictive layer 306. It is noted that Terfenol-D is a highly magnetostrictive material having a saturation magnetostriction constant, $\lambda$, in excess of about 1500 ppm (see FIG. 3b), and a saturation magnetization, $|4\pi M|$, in excess of about 7000 G (see FIG. 3b). It is also noted that PMN-PT is a highly piezoelectric material that has a piezoelectric coefficient on the order of about 1700 ppm when poled along the crystallographic <011> direction.

Each of the PMN-PT crystals corresponding to the respective piezoelectric layers 302, 304 (see FIG. 3a) is cut so that the <011> poling direction is perpendicular to the plane of the respective piezoelectric layers 302, 304. Further, the <001> crystallographic direction exhibiting maximum piezoelectric coefficient is disposed along the length of the respective piezoelectric layers 302, 304. Moreover, each of the PMN-PT crystals of the piezoelectric layers 302, 304 is bonded to the slab of Terfenol-D of the magnetostrictive layer 306 using a cyanoacrylate-based adhesive or any other suitable type of adhesive, such that their poling directions are opposite to one another.

In addition, each of the electrodes 308, 310 is implemented using gold or any other suitable type of conductor deposited on the exposed upper and lower surfaces of the piezoelectric layers 302, 304, respectively. Further, leads (not shown) can be attached to the respective electrodes 308, 310, and to the slab of Terfenol-D (i.e., the magnetostrictive layer 306) using low temperature solder or any other suitable type of solder. In accordance with one or more alternative embodiments of the disclosed tunable microwave magnetic devices, the ME transducer 300 can have any suitable geometry, and can include any other suitable multilayer structure and/or powder composites. Moreover, the ME transducer 300 can be implemented using rods and spheres (not shown) embedded in a host matrix (not shown), as known to those skilled in the art, or any other suitable structural arrangement.

To evaluate the performance of the ME transducer 300, a voltage, V, is applied across the electrodes 308, 310 of the ME transducer 300 using a high voltage amplifier to create an electric field in the ME transducer 300, and ultimately induce, via the ME effect, an effective internal magnetic field, $H_{INT}$, within the magnetostrictive layer 306. The effective internal magnetic field, $H_{INT}$, varies the magnetization state of the magnetostrictive layer 306, thereby creating an external, voltage-tuned, magnetic fringe field, $H_{EXT}$, emanating from the edges of the magnetostrictive layer 306. An electromagnet can be used to generate an external magnetic biasing field, $H_{BIAS}$ (not shown), which is applied to the ME transducer 300 to bias the magnetostrictive layer 306 near the maximum $d\lambda/dH$ point. Alternatively, at least one permanent magnet can be placed near the ME transducer 300 to generate the external magnetic biasing field, $H_{BIAS}$, for biasing the magnetostrictive layer 306. It is noted that the need for such external biasing components can be avoided by designing ME transducer 300 with a high remnant magnetization.

Figure 3C:
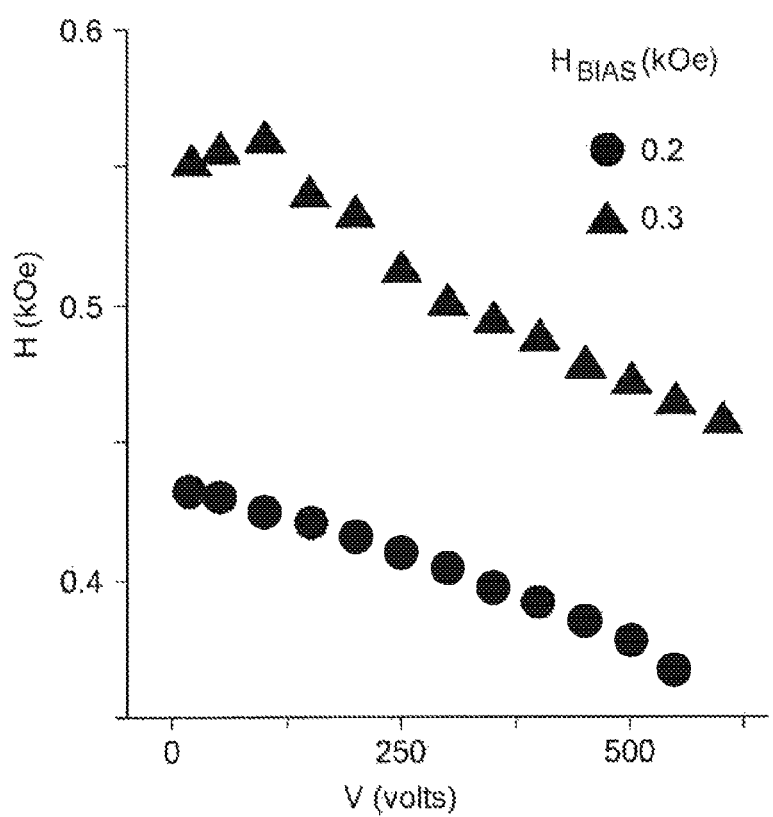

Having applied the voltage, V, across the electrodes 308, 310 of the ME transducer 300, the external magnetic fringe field, $H_{EXT}$, emanating from the edges of the ME transducer 300 can be measured using, for example, a Hall probe connected to a Gauss meter. FIG. 3c depicts a graphical illustration of the measured magnetic fringe field, H, as a function of the applied voltage, V, and the applied magnetic biasing field, $H_{BIAS}$. For example, with an applied magnetic biasing field, $H_{BIAS}$, of about 0.3 kOe, a change in the magnetic fringe field, H, of about 0.1 kOe can be measured as the applied voltage, V, is increased from about 0 volts to about 550 volts. Such a result demonstrates that a practical external, voltage-tuned, magnetic fringe field for use in tuning a microwave magnetic device can be generated using the ME transducer 300 of FIG. 3a.

Figure 4A:
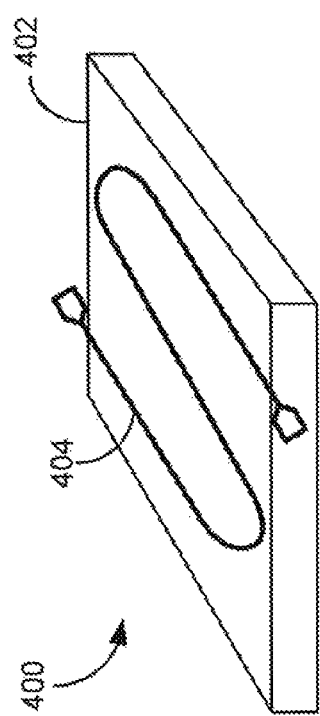
FIG. 4a is a perspective view of an exemplary meander line micro-strip ferrite phase shifter that can be incorporated into the voltage-tunable microwave magnetic device of FIG. 2.

In a second illustrative example, an exemplary meander line micro-strip ferrite phase shifter 400 is provided, as depicted in FIG. 4a. For example, the meander line micro-strip circuit 202 included in the microwave magnetic device 200 of FIG. 2 can be like the meander line micro-strip ferrite phase shifter 400 of FIG. 4a. As shown in FIG. 4a, the meander line micro-strip ferrite phase shifter 400 includes a ferrite substrate 402, and a micro-strip line 404 formed on the ferrite substrate 402. For example, the meander line micro-strip ferrite phase shifter 400 can be designed and simulated using any suitable finite element technique, as known to those skilled in the art. Further, both reciprocal and non-reciprocal performance of the meander line micro-strip ferrite phase shifter 400 can be achieved by suitably varying the coupling between the respective meander elements, as known to those skilled in the art.

Figure 4B:
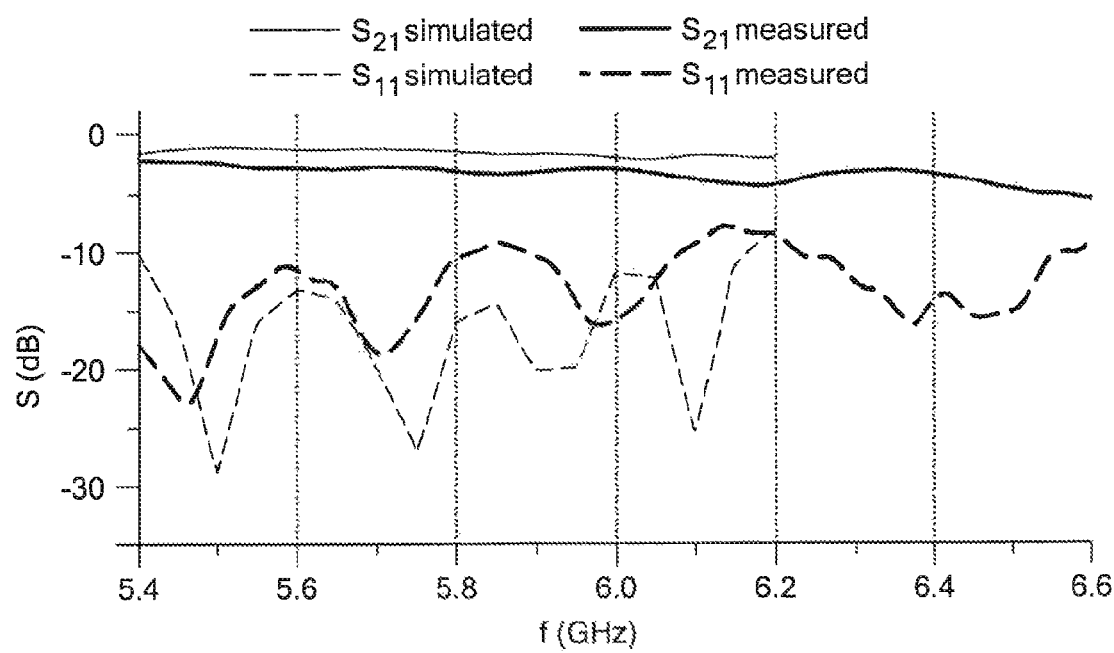

In this second illustrative example, the ferrite substrate 402 is implemented using commercially available polycrystalline YIG, having a saturation magnetization of about 1780 G, and a ferromagnetic resonance (FMR) line width of about 15 Oe. It is noted that any other suitable type of ferrite material may be employed, such as garnet, spinel, and hexagonal ferrites, to achieve operation from, for example, S band to W band. FIG. 4b depicts a graphical illustration of the simulated insertion loss, $S_{21}$, and the simulated return loss, $S_{11}$, with an external magnetic biasing field, $H_{BIAS}$, of about 200 Oe. In addition, FIG. 4c depicts a graphical illustration of the corresponding simulated differential phase shift, $\Delta\Phi$.

Figure 4C:
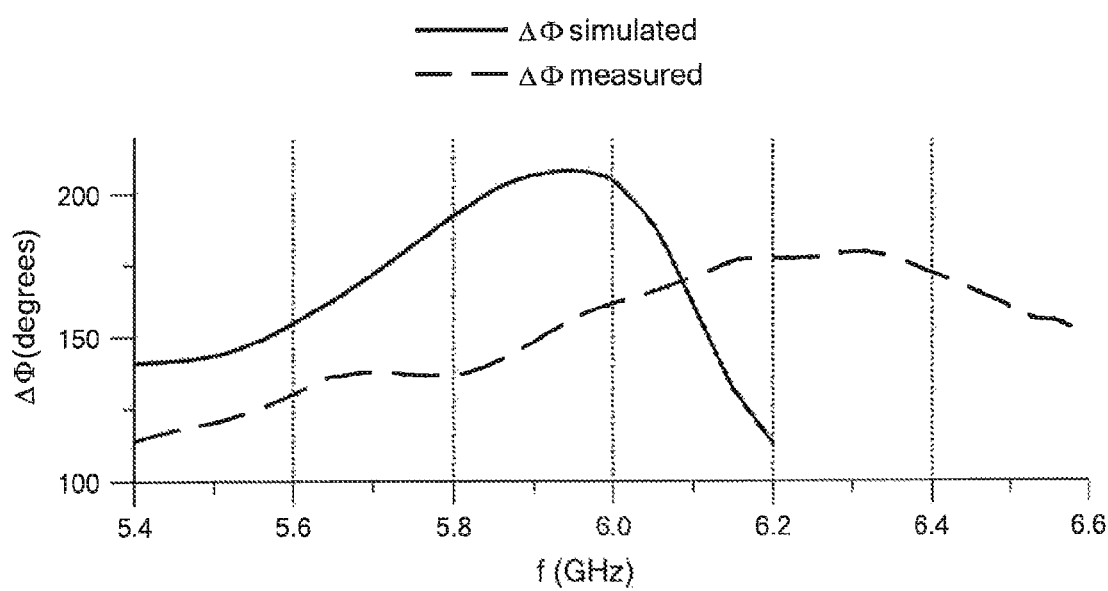

As shown in FIG. 4c, the meander line micro-strip ferrite phase shifter 400 exhibits a peak simulated differential phase shift, $\Delta\Phi$, of about 210° at a design frequency of 6 GHz. As shown in FIG. 4b, the corresponding simulated insertion loss, $|S_{21}|$, and the corresponding simulated return loss, $|S_{11}|$, are about 1.8 dB and 20 dB, respectively. It is noted that the value of the simulated differential phase shift, $\Delta\Phi$, can be obtained by subtracting the phase at an internal magnetic field, $H_{INT}$, of about 0 Oe within the ferrite substrate 402, from the phase at an internal magnetic field, $H_{INT}$, of about 100 Oe within the ferrite substrate 402. It is further noted that the value of the internal magnetic field, $H_{INT}$, employed in the finite element calculations is substantially equal to the magnetic biasing field, $H_{BIAS}$, minus the shape-dependent demagnetizing field of the ferrite substrate 402.

To obtain an indication of measured performance of the meander line micro-strip ferrite phase shifter 400, a prototype of the meander line micro-strip ferrite phase shifter 400 is fabricated on a polycrystalline YIG substrate using, for example, gold electroplating and liftoff lithography processes. Further, an electromagnet or at least one permanent magnet is used to generate the external magnetic biasing field, $H_{BIAS}$, and a vector network analyzer (VNA) is connected to the prototype device for evaluation purposes. FIG. 4b depicts a graphical illustration of the measured insertion loss, $S_{21}$, and the measured return loss, $S_{11}$, with a magnetic biasing field, $H_{BIAS}$, of about 200 Oe. Moreover, FIG. 4c depicts a graphical illustration of the corresponding measured differential phase shift, $\Delta\Phi$. As shown in FIG. 4c, a maximum measured differential phase shift of 180° is observed at about 6.3 GHz with the magnetic biasing field, $H_{BIAS}$, of about 200 Oe, which is in general agreement with the simulated differential phase shift of about 210° at the design frequency of 6 GHz discussed above.

In a third illustrative example, two ME transducers, each like the ME transducer 300 of FIG. 3a, are employed for voltage-tuning a meander line micro-strip ferrite phase shifter, such as the meander line micro-strip ferrite phase shifter 400 of FIG. 4a. In this third illustrative example, the magnetostrictive layer of each of the two ME transducers is implemented as a slab of Terfenol-D, and the piezoelectric layers of each ME transducer are implemented as PMN-PT single crystals. Further, like the voltage-tunable microwave magnetic device 200 of FIG. 2, the Terfenol-D slabs within the two ME transducers are aligned in the plane of, and in contact with, the ferrite substrate of the meander line micro-strip ferrite phase shifter to assure effective penetration of the ferrite substrate by the magnetic fringe fields emanating from the edges of the respective ME transducers. In one or more alternative embodiments, one or more such ME transducers can be operatively mounted above and/or below the meander line micro-strip ferrite phase shifter. Moreover, an external magnetic biasing field, $H_{BIAS}$, of about 200 Oe is applied to the ME transducers using an electromagnet, or at least one permanent magnet. In addition, a voltage is applied across the ME transducers using a high voltage amplifier, and a VNA is connected to the meander line micro-strip ferrite phase shifter device for evaluation purposes.

Figure 5:
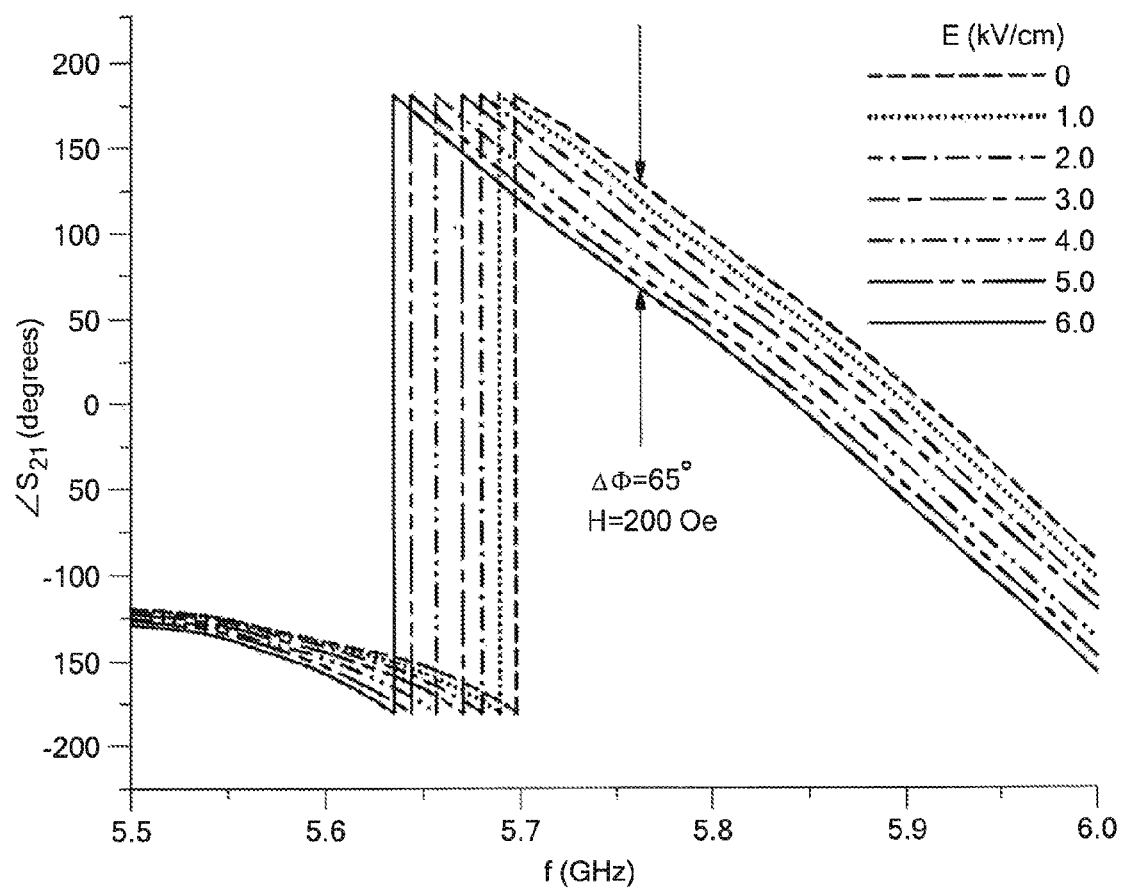
FIG. 5 is a graphical illustration of insertion phase as a function of applied electric field for the voltage-tunable microwave magnetic device of FIG. 2.

FIG. 5 depicts the insertion phase, $<S_{21}$, of the meander line micro-strip ferrite phase shifter device as a function of the applied voltage, which can be converted to electric field, E, by dividing the applied voltage by the thickness (e.g., about 1 mm) of the PMN-PT crystals within the ME transducers. As shown in FIG. 5, a phase shift of about 65° is observed as the electric field, E, is increased from about 0 kV/cm to about 6 kV/cm. Such a result demonstrates that a practical voltage-tunable microwave magnetic device, such as a meander line micro-strip ferrite phase shifter, can be realized using one or more external ME transducers as tuning elements for the device.

Figure 6:
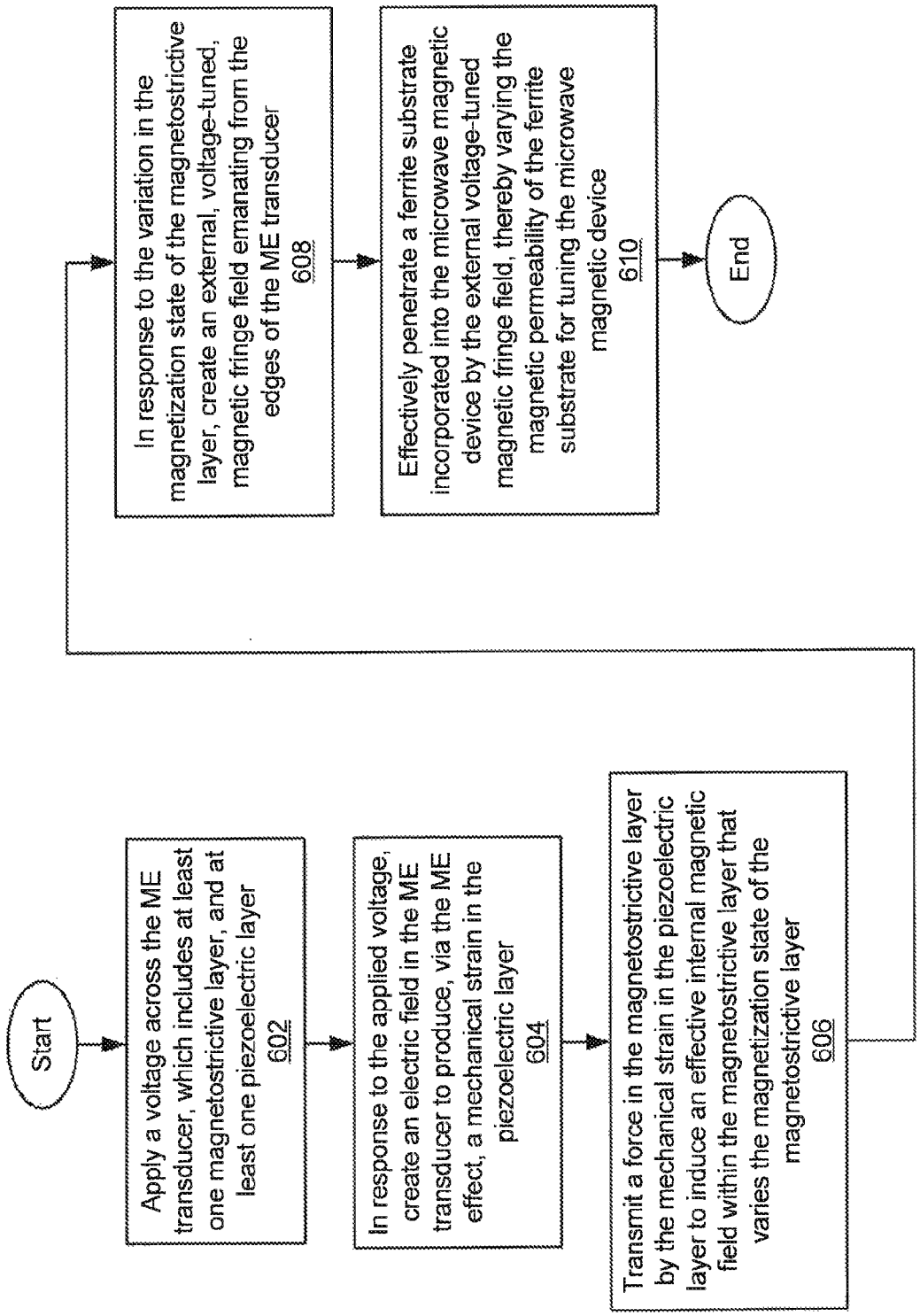
FIG. 6 is a flow diagram of a method of voltage-tuning a microwave magnetic device, according to the present application.

In accordance with the present application, a method of voltage-tuning a microwave magnetic device, using at least one ME transducer, is described below with reference to FIG. 6. As depicted in step 602, a voltage is applied across the ME transducer, which includes at least one magnetostrictive layer, and at least one piezoelectric layer. In response to the applied voltage, an electric field is created in the ME transducer, as depicted in step 604, producing, via the ME effect, a mechanical strain in the piezoelectric layer. As depicted in step 606, a force is transmitted in the magnetostrictive layer by the mechanical strain in the piezoelectric layer, inducing an effective internal magnetic field within the magnetostrictive layer that varies the magnetization state of the magnetostrictive layer. As depicted in step 608, in response to the variation in the magnetization state of the magnetostrictive layer, an external, voltage-tuned, magnetic fringe field is created, emanating from the edges of the ME transducer. As depicted in step 610, a ferrite substrate incorporated into the microwave magnetic device is effectively penetrated by the external magnetic fringe field, thereby varying the magnetic permeability of the ferrite substrate for tuning the microwave magnetic device.

Having described the above illustrative embodiments of the disclosed tunable microwave magnetic devices, it is noted that other alternative embodiments or variations may be made/practiced. For example, in one or more alternative embodiments, to reduce the applied voltage requirements of the microwave magnetic devices, the thickness of the piezoelectric layer(s) within the ME transducer(s) can be reduced. In this way, substantially the same electric field intensity can be created in the ME transducer as previously described, but using the reduced level of applied voltage. It is noted that when the thickness of the piezoelectric layer is reduced, corresponding reductions in the thicknesses of the magnetostrictive layer within the ME transducer and the ferrite substrate within the microwave magnetic device may have to be made to reduce demagnetizing fields, and to assure efficient magnetic fringe field tuning of the device. In addition, to further reduce the demagnetization fields and the applied voltage requirements, any suitable thick film technology may be employed to implement the various components of the microwave magnetic device and/or the ME transducer, including, but not limited to, pulsed laser deposition, liquid phase epitaxy, spin spray, and tape casting. Use of such thick film technology may also provide for increased phase shifts, improved insertion loss performance, and enhanced device miniaturization and integration with other system components.

It will be appreciated by those of ordinary skill in the art that modifications to and variations of the above-described tunable microwave magnetic devices, and methods of voltage tuning such microwave magnetic devices using magnetoelectric transducers, may be made without departing from the inventive concepts disclosed herein. Accordingly, this disclosure should not be viewed as limited except as by the scope and spirit of the appended claims.

What is claimed is:

1. A tunable microwave magnetic device, comprising:
   a ferrite substrate;
   a micro-strip circuit formed on the ferrite substrate; and at least one magnetoelectric (ME) transducer, wherein the at least one ME transducer includes one or more piezoelectric layers and one or more magnetostrictive layers, wherein the at least one ME transducer is operative, in response to a voltage applied across the at least one ME transducer, to create an external magnetic fringe field emanating from the at least one ME transducer, the external magnetic fringe field effectively penetrating the ferrite substrate for tuning the microwave magnetic device.

2. The device of claim 1, each of the one or more magnetostrictive layers being bonded to at least one of the one or more piezoelectric layers.

3. The device of claim 2 wherein at least one of the one or more magnetostrictive layers is disposed in a plane of the ferrite substrate.

4. The device of claim 2 wherein at least one of the one or more magnetostrictive layers is disposed in contact with the ferrite substrate.

5. The device of claim 2 wherein the one or more magnetostrictive layers are implemented using Terfenol-D.

6. The device of claim 2 wherein the one or more piezoelectric layers are implemented using lead magnesium niobate-lead titanate (PMN-PT) single crystal.

7. The device of claim 2 wherein the voltage applied across the at least one ME transducer also creates an electric field in the at least one ME transducer, the electric field producing, via an ME effect, a mechanical strain in the one or more piezoelectric layers, and wherein each of the one or more piezoelectric layers is operative, in response to the mechanical strain, to transmit a force in at least one of the one or more magnetostrictive layers, thereby inducing an effective internal magnetic field within the at least one of the one or more magnetostrictive layers.

8. The device of claim 7 wherein the effective internal magnetic field within the at least one of the one or more magnetostrictive layers varies a magnetization state of the at least one of the one or more magnetostrictive layers, and wherein the at least one of the one or more magnetostrictive layers is operative, in response to the varied magnetization state, to create the external magnetic fringe field emanating from the at least one ME transducer.

9. The device of claim 1 wherein the at least one ME transducer includes two piezoelectric layers of the one or more piezoelectric layers, and a single magnetostrictive layer of the one or more magnetostrictive layers between the two piezoelectric layers.

10. The device claim 9 wherein the single magnetostrictive layer is disposed in contact with the ferrite substrate.

11. The device of claim 9 wherein the single magnetostrictive layer is mechanically coupled to each of the two piezoelectric layers.

12. The device of claim 9 wherein the single magnetostrictive layer is disposed in a plane of the ferrite substrate.

13. The device of claim 1 wherein the at least one ME transducer operates with a high remnant magnetization, obviating a need for external biasing components.

14. The device of claim 1 wherein the micro-strip circuit formed on the ferrite substrate is a meander line micro-strip circuit.

15. The device of claim 14 wherein the meander line micro-strip circuit is a meander line micro-strip ferrite phase shifter.

16. A method of tuning a microwave magnetic device, comprising the steps of:
disposing the microwave magnetic device proximate to at least one magnetoelectric (ME) transducer, wherein the at least one ME transducer includes one or more piezoelectric layers and one or more magnetostrictive layers; and
applying a voltage across the at least one ME transducer to create an external magnetic fringe field emanating from the at least one ME transducer, the external magnetic fringe field effectively penetrating the microwave magnetic device for tuning the microwave magnetic device.

17. The method of claim 16 wherein the microwave magnetic device includes a ferrite substrate, each of the one or more magnetostrictive layers being bonded to at least one of the one or more piezoelectric layers, and wherein the disposing of the microwave magnetic device includes disposing the microwave magnetic device proximate to the at least one ME transducer such that at least one of the one or more magnetostrictive layers of the at least one ME transducer is in a plane of the ferrite substrate.

18. The method of claim 16 wherein the microwave magnetic device includes a ferrite substrate, each of the one or more magnetostrictive layers being bonded to at least one of the one or more piezoelectric layers, and wherein the disposing of the microwave magnetic device further includes disposing the microwave magnetic device proximate to the at least one ME transducer such that at least one of the one or more magnetostrictive layers of the at least one ME transducer is in contact with the ferrite substrate.

19. A tunable microwave magnetic device, comprising:
a substrate having a magnetic permeability;
a circuit formed on the substrate; and
at least one magnetoelectric (ME) transducer, wherein the at least one ME transducer includes one or more piezoelectric layers and one or more magnetostrictive layers,
wherein the at least one ME transducer is operative, in response to a voltage applied across the at least one ME transducer, to create an external magnetic fringe field emanating from the at least one ME transducer, the external magnetic fringe field varying the magnetic permeability of the substrate for tuning the microwave magnetic device.

20. The device of claim 19 wherein the substrate is a ferrite substrate.

* * * * *